United States Patent [19]
Di Forte Poisson et al.

[11] Patent Number: 4,494,237
[45] Date of Patent: Jan. 15, 1985

[54] SHORTWAVE SEMICONDUCTOR LASER

[75] Inventors: Marie-Antoinette Di Forte Poisson; Jean-Pierre Hirtz; Jean-Pascal Duchemin; Baudouin de Cremoux, all of Paris, France

[73] Assignee: Thomson-CSF, Paris, France

[21] Appl. No.: 388,995

[22] Filed: Jun. 16, 1982

[30] Foreign Application Priority Data

Jun. 19, 1981 [FR] France .................... 81 12143

[51] Int. Cl.$^3$ ............................................. H01S 3/19
[52] U.S. Cl. .................................... 372/45; 357/17; 357/61
[58] Field of Search ............... 372/44, 45, 46; 357/17, 357/61, 16

[56] References Cited

FOREIGN PATENT DOCUMENTS 0038981 4/1981 European Pat. Off. ............. 372/44
2001870 1/1970 Fed. Rep. of Germany ........ 372/44

OTHER PUBLICATIONS

Hitchens et al., "Low-threshold LPE $In_{1-x'}Ga_{x'}P_{1-z'}As_{z'}/In_{1-x}Ga_xP_{1-z}As_z/In_{1-x'}Ga_{x'}P_{1-z'}As_{z'}$ yellow double-heterojunction laser diodes", Appl. Phys. Lett., vol. 27, pp. 245-247, Aug. 15, 1975.

IEEE Transactions on Electron Devices, vol. ED-26, No. 8, Aug. 1979.

Primary Examiner—James W. Davie
Attorney, Agent, or Firm—Oblon, Fisher, Spivak, McClelland & Maier

[57] ABSTRACT

A laser diode having an active layer which has a composition:

$$Ga_xIn_{1-x}P$$

with: $0.51 \leq x \leq 0.53$ corresponding to a point of the straight line of the quaternary diagram GaInAsP which satisfies the condition of compatability of the crystal lattice parameter with that of a GaAs substrate. The confinement layers of the laser diode have a composition corresponding to a point of the straight line of the adjacent quaternary diagram GaAlInP which satisfies the condition of compatability of the crystal lattice parameter with that of the GaAs substrate, namely in respect of that point of said straight line which is located at the most favorable end of the line:

$$In_zAl_{1-z}P$$

with: $0.45 \leq z \leq 0.49$.

6 Claims, 3 Drawing Figures

SHORTWAVE SEMICONDUCTOR LASER

BACKGROUND OF THE INVENTION

1. Field of the Invention

This invention relates to a semiconductor laser (laser diode) for obtaining radiation having a relatively short wavelength in comparison with the usual wavelengths of semiconductor lasers.

2. Description of the Prior Art

In fact, of the conventional semiconductor laser diodes known to the inventors, the shortest wavelength obtained with semiconductor laser diodes is of the order of 0.8 micron and is therefore located in the infrared region. In contrast, the invention makes it possible to attain the visible light region, thus offering the following advantages:

(1) the possibility of visual control;
(2) enhanced resolution of optical systems and especially readers for videodisks, audiodisks and optical disks insofar as the resolution is limited by the diffraction phenomenon.

In these applications, the laser radiation is focused on the surface of the disk. The radius of the focal spot is given as a function of the wavelength and of the numerical aperture (sin U) by the formula:

$$R = (0.61\lambda)/(\sin U)$$

In order to increase the resolution, it is necessary to reduce R and therefore:

either to reduce the wavelength, which is the object of the present invention;

or to increse the numerical aperture, thus producing an increase in aberrations which are proportional to the fourth power of U, thus giving rise to a disadvantage in that it is necessary to correct these aberrations by means of highly efficient and therefore very costly optical systems.

In consequence, it is clearly an advantage to give preference to a reduction in the wavelength emitted by the semiconductor laser.

SUMMARY OF THE INVENTION

The laser according to the invention comprises a GaAs substrate of a predetermined conductivity type and at least the following epitaxial layers: a first confinement layer of the same conductivity type as the substrate, an active layer and a second confinement layer of opposite conductivity type, the confinement layers being constituted by materials having a wider forbidden band than that of the active layer.

The distinctive feature of the laser lies in the fact that the material constituting the active layer is an alloy corresponding to one of the formulae:

$$Ga_x In_{1-x} As_y P_{1-y} \quad (1)$$

where x has a value between zero and one, y has a zero value or a value between zero and one, x and y being determined with respect to each other by the relation, verified to within 1%:

$$y = (0.42x - 0.22)/(0.01x + 0.19) \quad (I)$$

and:

$$Ga_x Al_z In_{1-x-z} P \quad (2)$$

where x has a value between zero and one, z has a zero value or a value between zero and one, x and z being determined with respect to each other by the relation, verified to within 1%:

$$z = (0.22 - 0.42x)/(0.41 + 5.04x) \quad (II)$$

The laser is further distinguished by the fact that the confinement layers are of an alloy which corresponds to the formula:

$$In_z Al_{1-z} P \quad (3)$$

with:

$$0.45 \leq z \leq 0.49 \quad (III)$$

BRIEF DESCRIPTION OF THE DRAWINGS

Other features of the invention will be more apparent upon consideration of the following description and accompanying drawings, wherein.

DESCRIPTION OF THE PREFERRED EMBODIMENTS

Figure 1:
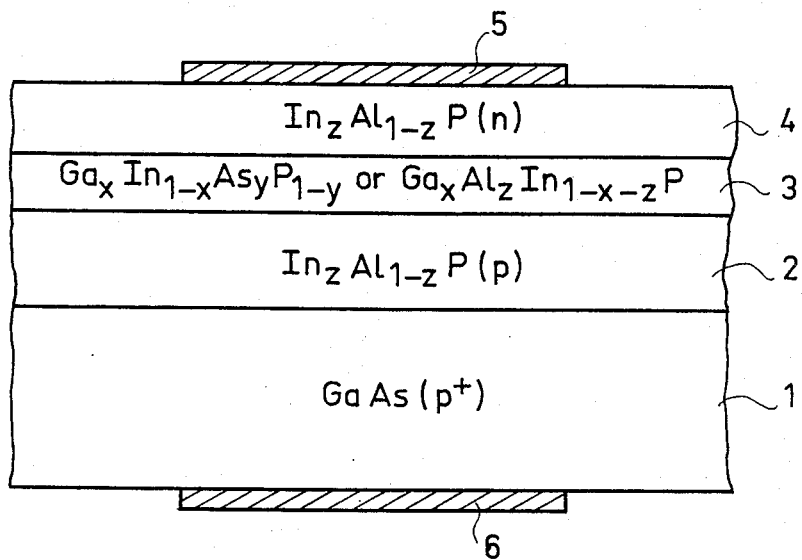
FIGS. 1 and 2 represent embodiments of the invention.
Figure 2:
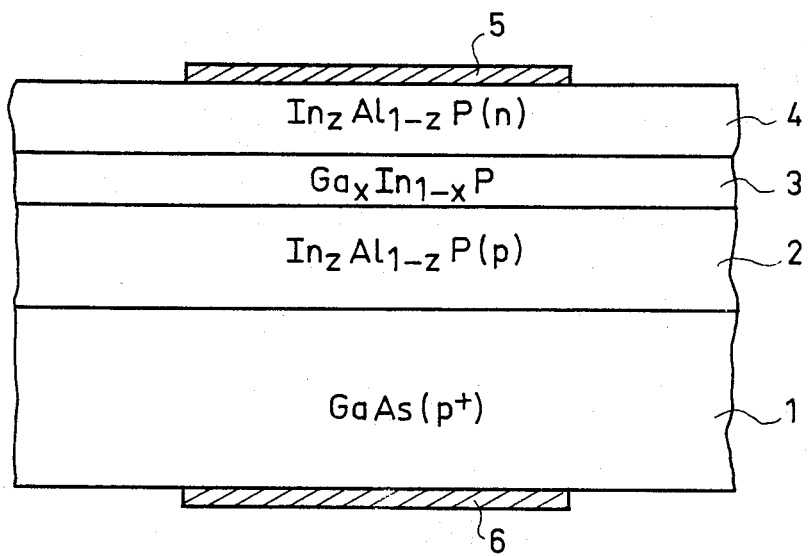

The schematic fragmentary sectional views of FIGS. 1 and 2 show a semiconductor device according to the invention and comprising a gallium arsenide substrate 1 which supports a confinement layer 2, an active layer 3, another confinement layer 4 and, finally, metallization layers 5 and 6 forming ohmic contacts with the material of the end faces. Said metallization layers are intended to permit a good connection to a voltage source.

In all the cases shown, the substrate is of p+ doped GaAs. n+ doping is also possible and corresponds to another series of examples (not shown) in which doping of the different layers and of the substrate would be of opposite conductivity type, in which case the polarities of the voltage source would be reversed.

In the example of FIG. 1, the characteristics of the layers are as follows:

Layers 2 and 4: of an alloy having the formula:

$$In_z Al_{1-z} P$$

in which z satisfies the above-mentioned relation (III).

In addition, the layer 2 is p-doped and the layer 4 is n-doped.

Layer 3: of an alloy having a composition given by one of the formulae (1) and (2); x and y, or x and z, as the case may be, satisfy the different conditions laid down in the foregoing and in particular the relations (I) and (II). These relations are necessary in order to permit good epitaxial growth at the time of fabrication of the device by epitaxial growth of layers having different compositions on one and the same GaAs substrate. Said relations express the fact that the parameters of the crystal lattices must be equal to within 1 or 2%.

In the example of FIG. 2, the characteristics of the layers are as follows:

Layers 2 and 4: of an alloy having the same composition and the same doping as layers 2 and 4 of FIG. 1.

Layer 3: an alloy having the composition:
TI $Ga_xIn_{1-x}P$

This formula corresponds to the case of:

$y = z = 0$

Layer 3 can be either n-doped or p-doped.

In order to explain the operation of the laser diode in the device shown in FIG. 1 or FIG. 2, consideration will first be given to the general knowledge acquired in accordance with conventional practice and then to the diagram of FIG. 3.

Under the general operating conditions of laser diodes, the active layer must be fabricated from a compound known as III-V (formed of elements of the third and fifth columns of the Periodic Table). This is the case of the alloys of the layers 3 of the devices shown in FIGS. 1 and 2. Furthermore, this active layer must be surrounded by two so-called confinement layers of material having a forbidden band of greater width than that of the material which constitutes the active layer. This point will be verified in FIG. 3.

Two juxtaposed diagrams of quaternary alloys are in fact shown in FIG. 3 as follows:
  a square diagram in which the representative points of the four alloys InAs, GaAs, GaP and InP are joined to each other;
  a triangular diagram in which the three apices are the representative points of the compounds InP, GaP and AlP.

The two diagrams which are juxtaposed by means of the segment InP-GaP delimit two spaces in which the representative points designate:
  an alloy $Ga_xIn_{1-x}As_yP_{1-y}$ within the square, the values of x and y being determined by the distances from the representative point to the segments InP-InAs (in the case of x) and InP-GaP (in the case of y);
  an alloy $Ga_xAl_zIn_{1-x-z}P$ within the triangle, the values of x and z being measured on lines parallel to the bases InP-Gap (in the case of x) and Alp-InP (in the case of z).

Figure 3:
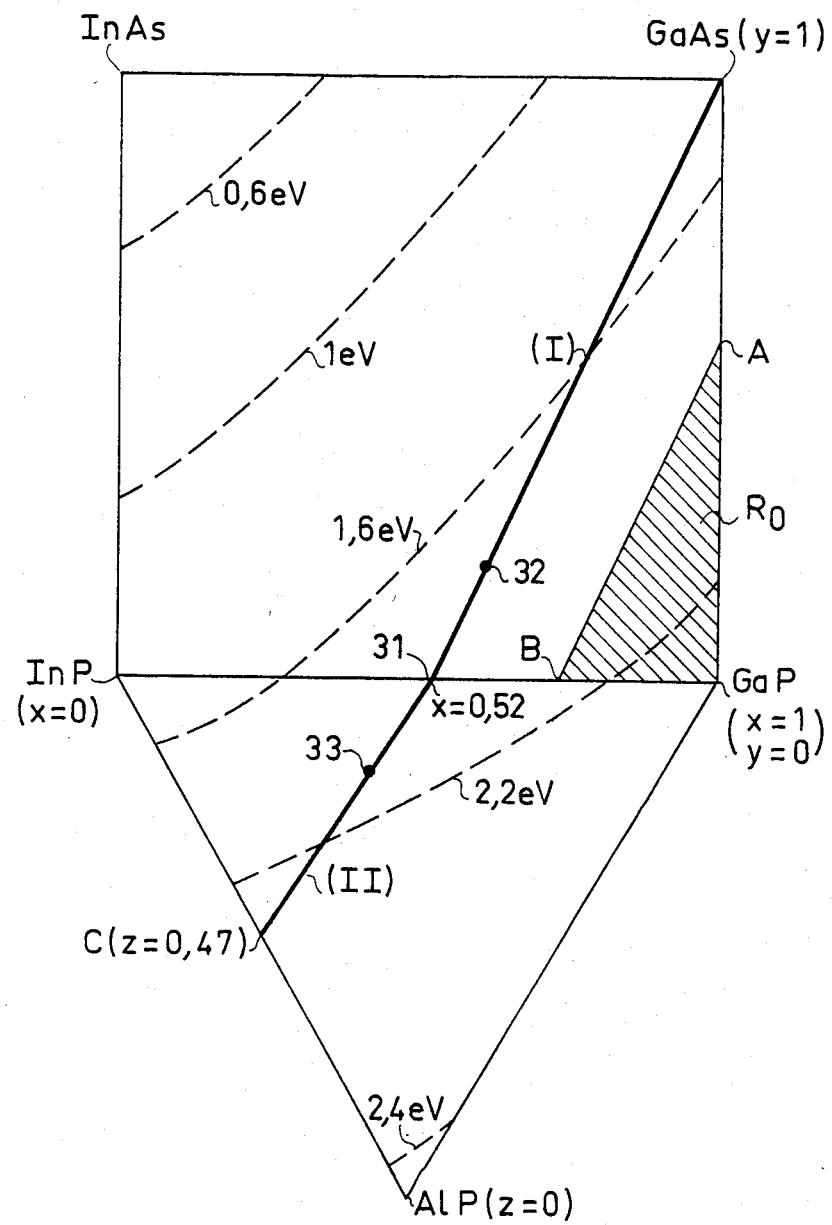
FIG. 3 is an explanatory diagram.

Furthermore, the dashed lines in the diagram of FIG. 3 show that the forbidden bandwidth remains constant at all points of the diagram. It is observed that the forbidden bandwidth increases from the apex InAs (in this region, the forbidden bandwidth is smaller than 0.6 electron-volt) to the apex AlP (in this region, the forbidden bandwidth is in the vicinity of 2.4 eV).

Finally, a straight-line segment AB delimits a region $R_o$ of the square diagram in which the transitions of the semiconductor material are of the indirect type. In this region, there is no possibility of forming a laser having an active layer in which the material has a composition corresponding to one point of the region.

In the diagram of FIG. 3, the representative points 31, 32 and 33 designate the following:
  (1) at point 31 having an abscissa $x=0.52$ on the straight line InP-GaP, a composition of the active layer of a laser in accordance with FIG. 2;
  (2) at point 32 ($x=0.6$; $y=0.2$), a laser active-layer composition in accordance with FIG. 1 in the case of an alloy having the formula (1). This representative point is located on the straight line (I) which joins the GaAs apex of the square to the point 31. The equation of the straight line (I) in the system of coordinates x and y is that of relation (I);
  (3) at 33 ($x=0.34$; $z=0.4$), a laser active-layer composition in accordance with FIG. 1 in the case of an alloy corresponding to formula (2). This representative point is located in the straight line (II) which joins point 31 to point C which is the representative point of the alloy having the following composition:

$In_{0.47}Al_{0.53}P$ which is the composition of the confinement layers (where 0.47 is the intermediate value of the range of values of z defined by relation III).

It is clearly apparent that lasers having active layer compositions represented by the points 31, 32 and 33 have a wavelength which is smaller as their forbidden bandwidth is larger or in other words when coming closer to the point C on the straight line InP-AlP.

An active layer composition corresponding to point 31 has a forbidden bandwidth of 1.9 eV, which corresponds to an emission wavelength of 0.65 micron.

In a preferred embodiment of the invention, the active layer 3 shown in FIGS. 1 and 2 has the following composition:

$Ga_xIn_{1-x}P$ with: $0.51 \leq x \leq 0.53$

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A semiconductor device comprising:
a GaAs substrate of a predetermined conductivity type and at least the following epitaxial layers: a first confinement layer of the same conductivity type as the substrate, an active layer and a second confinement layer of opposite conductivity type, the confinement layers being constituted by materials having a wider forbidden band than that of the active layer, the material constituting the active layer being formed of an alloy corresponding to the formula:

$Ga_xIn_{1-x}As_yP_{1-y}$ where x has a value between zero and one, y has a zero value or a value between zero and one, x and y being determined with respect to each other by the relation varified to within 1%:

$y = (0.42x - 0.22)/(0.01x + 0.19)$ and the confinement layers being formed of an alloy corresponding to the formula:

$In_zAl_{1-z}P$ with: $0.45 \leq z \leq 0.49$.

2. A semiconductor device comprising:
a GaAs substrate of a predetermined conductivity type and at least the following epitaxial layers: a first confinement layer of the same conductivity type as the substrate, an active layer and a second confinement layer of opposite conductivity type, the confinement layers being constituted by materials having a wider forbidden band than that of the active layer, wherein the material constituting the active layer is formed of an alloy corresponding to the formula:

$$Ga_xAl_zIn_{1-x-z}P$$

where x has a value between zero and one, z has a zero value or a value between zero and one, x and z being determined with respect to each other by the relation verified to within 1%:

$$z = (0.22 - 0.42x)/0.41 + 5.04x)$$

and the confinement layers are formed of an alloy corresponding to the formula:

$$In_zAl_{1-z}P$$

with: $0.45 \leq z \leq 0.49$.

3. A device according to claim 1 or claim 2, wherein the material constituting the active layer has the following composition:

$$Ga_xIn_{1-x}P$$

with: $0.51 \leq x \leq 0.53$.

4. In a shortwave semiconductor laser, the improvement comprising:

a GaAs substrate of a predetermined conductivity type and at least the following epitaxial layers: a first confinement layer of the same conductivity type as the substrate, an active layer and a second confinement layer of opposite conductivity type, the confinement layers being constituted by materials having a wider forbidden band than that of the active layer, the material constituting the active layer being formed of an alloy corresponding to the formula:

$$Ga_xIn_{1-x}As_yP_{1-y}$$

where x has a value between zero and one, y has a zero value or a value between zero and one, x and y being determined with respect to each other by the relation verified to within 1%:

$$y = (0.42x - 0.22)/(0.01x + 0.19)$$

and the confinement layers being formed of an alloy corresponding to the formula:

$$In_zAl_{1-z}P$$

with: $0.45 \leq z \leq 0.49$.

5. In a shortwave semiconductor laser, the improvement comprising:

a GaAs substrate of a predetermined conductivity type and at least the following epitaxial layers: a first confinement layer of the same conductivity type as the substrate, an active layer and a second confinement layer of opposite conductivity type, the confinement layers being constituted by materials having a wider forbidden band than that of the active layer, wherein the material constituting the active layer is formed of an alloy corresponding to the formula:

$$Ga_xAl_zIn_{1-x-z}P$$

where x has a value between zero and one, z has a zero value or a value between zero and one, x and z being determined with respect to each other by the relation verified to within 1%:

$$z = (0.22 - 0.42x)/(0.41 + 5.04x)$$

and the confinement layers are formed of an alloy corresponding to the formula:

$$In_zAl_{1-z}P$$

with: $0.45 \leq z \leq 0.49$.

6. A laser according to claim 4 or claim 5, wherein the material constituting the active layer has the following composition:

$$Ga_xIN_{1-x}P$$

with: $0.51 \leq x \leq 0.53$.

* * * * *